(12) United States Patent
Kakumu et al.

(10) Patent No.: US 12,302,548 B2
(45) Date of Patent: May 13, 2025

(54) MEMORY DEVICE USING SEMICONDUCTOR ELEMENT

(71) Applicant: Unisantis Electronics Singapore Pte. Ltd., Singapore (SG)

(72) Inventors: Masakazu Kakumu, Tokyo (JP); Koji Sakui, Tokyo (JP); Nozomu Harada, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 494 days.

(21) Appl. No.: 17/903,502

(22) Filed: Sep. 6, 2022

(65) Prior Publication Data

US 2023/0115447 A1     Apr. 13, 2023

(30) Foreign Application Priority Data

Sep. 8, 2021   (WO) .................. PCT/JP2021/033012

(51) Int. Cl.
*H10B 12/00*   (2023.01)
*G11C 5/06*    (2006.01)
(Continued)

(52) U.S. Cl.
CPC ............. *H10B 12/20* (2023.02); *G11C 5/063* (2013.01); *G11C 7/1096* (2013.01); *H10B 99/20* (2023.02);
(Continued)

(58) Field of Classification Search
CPC ........ H10B 12/20; H10B 99/20; G11C 5/063; G11C 7/1096; G11C 11/404; H10D 84/138; H10D 18/00
See application file for complete search history.

(56) References Cited

U.S. PATENT DOCUMENTS

2002/0034855 A1*  3/2002  Horiguchi .......... H10D 30/6735
                                            257/E21.654
2006/0049444 A1   3/2006  Shino
(Continued)

FOREIGN PATENT DOCUMENTS

JP    2006-080280 A    3/2006
JP    2008-218556 A    9/2008

OTHER PUBLICATIONS

Hiroshi Takato, Kazumasa Sunouchi, Naoko Okabe, Akihiro Nitayama, Katsuhiko Hieda, Fumio Horiguchi, and Fujio Masuoka: "Impact of Surrounding Gate Transistor (SGT) for Ultra-High-Density LSI's" IEEE Transaction on Electron Devices, vol. 38, No. 3, pp. 573-578 (1991).

(Continued)

*Primary Examiner* — Jeff W Natalini
*Assistant Examiner* — Brandon C Fox
(74) *Attorney, Agent, or Firm* — Crowell & Moring LLP

(57) ABSTRACT

A groove is formed in a first semiconductor layer 1, a sidewall of the groove is coated with a first insulating film 2, a first impurity layer 3 and a second impurity layer 4 thereon are disposed in the groove, a second semiconductor layer 7 is disposed on the second impurity layer, a first semiconductor is disposed at the other part, an $n^+$ layer $6a$ and an $n^+$ layer $6c$ are positioned at respective ends of the second semiconductor layer 7 and connected to a source line SL and a bit line BL, respectively, a first gate insulating layer 8 is formed on the second semiconductor layer 7, and a first gate conductor layer 9 is connected to a word line WL. Voltage applied to the source line SL, a plate line PL connected to the first semiconductor layer 1, the word line WL, and the bit line BL is controlled to perform data holding operation of holding, near the gate insulating layer, holes generated by an impact ionization phenomenon in a channel region 12 of the second semiconductor layer or by gate-induced drain leakage current, and data erase operation of removing the holes from the channel region 12.

12 Claims, 4 Drawing Sheets

(51) Int. Cl.
*G11C 7/10* (2006.01)
*H10B 99/00* (2023.01)
*H10D 18/00* (2025.01)
*H10D 84/00* (2025.01)
*G11C 11/404* (2006.01)

(52) U.S. Cl.
CPC .......... *H10D 84/138* (2025.01); *G11C 11/404* (2013.01); *H10D 18/00* (2025.01)

(56) References Cited

U.S. PATENT DOCUMENTS

| | | |
|---|---|---|
| 2008/0212366 A1 | 9/2008 | Ohsawa |
| 2010/0142294 A1* | 6/2010 | Carman ................ H10B 12/20 257/329 |
| 2024/0292593 A1* | 8/2024 | Sakui .................... G11C 11/404 |

OTHER PUBLICATIONS

H. Chung, H. Kim, H. Kim, K. Kim, S. Kim, K. Song, J. Kim, Y.C. Oh, Y. Hwang, H. Hong, G. Jin, and C. Chung: "Novel 4F$^2$ DRAM Cell with Vertical Pillar Transistor(VPT)," 2011 Proceeding of the European Solid-State Device Research Conference, (2011).

H. S. Philip Wong, S. Raoux, S. Kim, Jiale Liang, J. P. Reifenberg, B. Rajendran, M. Asheghi and K. E. Goodson: "Phase Change Memory," Proceeding of IEEE, vol. 98, No. 12, December, pp. 2201-2227 (2010).

K. Tsunoda, K. Kinoshita, H. Noshiro, Y. Yamazaki, T. Iizuka, Y. Ito, A. Takahashi, A. Okano, Y. Sato, T. Fukano, M. Aoki, and Y. Sugiyama : "Low Power and high Speed Switching of Ti-doped NiO ReRAM under the Unipolar Voltage Source of less than 3V," IEDM (2007).

W. Kang, L. Zhang, J. Klein, Y. Zhang, D. Ravelosona, and W. Zhao: "Reconfigurable Codesign of STT-MRAM Under Process Variations in Deeply Scaled Technology," IEEE Transaction on Electron Devices, pp. 1-9 (2015).

M. G. Ertosum, K. Lim, C. Park, J. Oh, P. Kirsch, and K. C. Saraswat : "Novel Capacitorless Single-Transistor Charge-Trap DRAM (1T CT DRAM) Utilizing Electrons," IEEE Electron Device Letter, vol. 31, No. 5, pp. 405-407 (2010).

E. Yoshida, and T. Tanaka: "A Capacitorless 1T-DRAM Technology Using Gate-Induced Drain-Leakage (GIDL) Current for Low-Power and High-Speed Embedded Memory," IEEE Transactions on Electron Devices, vol. 53, No. 4, pp. 692-697, Apr. 2006.

Md. Hasan Raza Ansari, Nupur Navlakha, Jae Yoon Lee, Seongjae Cho, "Double-Gate Junctionless 1T DRAM With Physical Barriers for Retention Improvement", IEEE Trans, on Electron Devices vol. 67, pp. 1471-1479 (2020).

\* cited by examiner

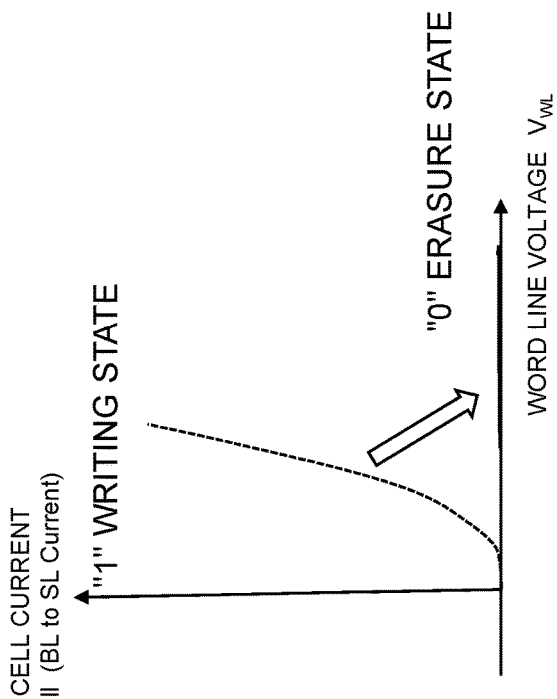
FIG. 3C
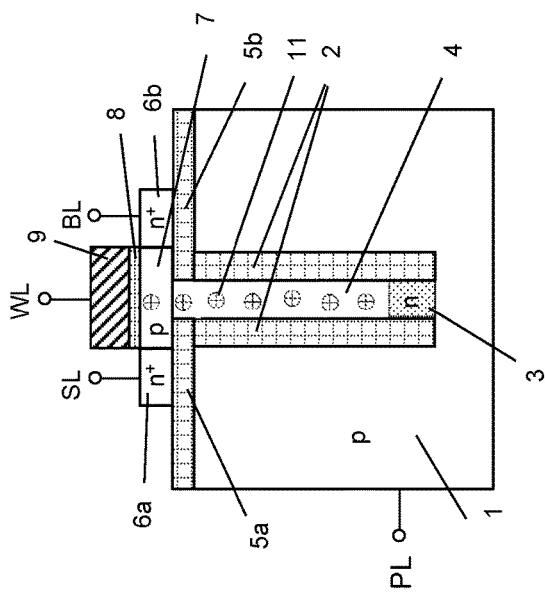
FIG. 3A
FIG. 3B

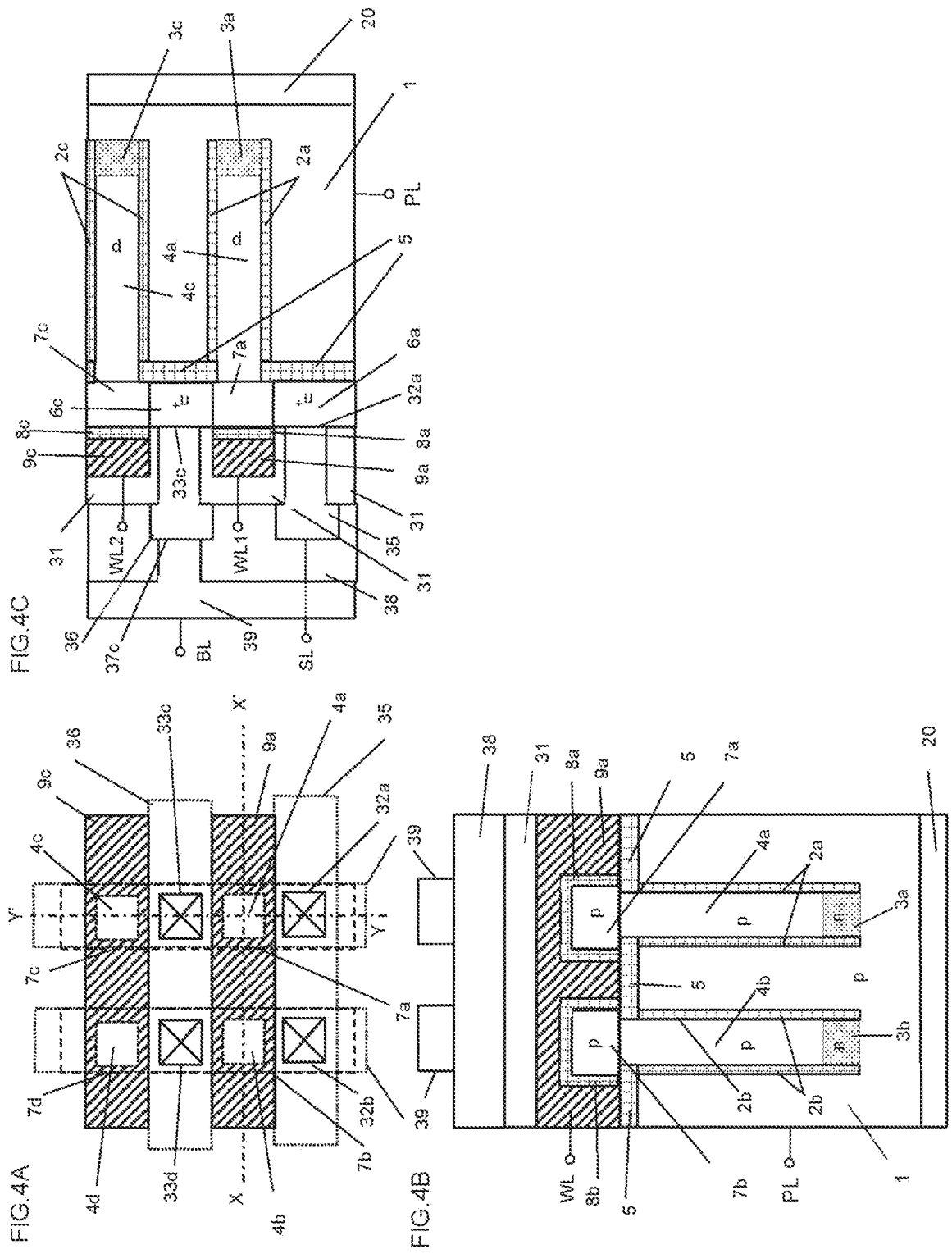

MEMORY DEVICE USING SEMICONDUCTOR ELEMENT

CROSS-REFERENCE TO RELATED APPLICATIONS

This application claims priority to PCT/JP2021/033012 filed Sep. 8, 2021, the enter content of which is incorporated herein by reference.

TECHNICAL FIELD

The present invention relates to a memory device using a semiconductor element.

BACKGROUND ART

High integration, high performance, low electric power consumption, and high functionality of a memory element have been requested in recent development of large scale integration (LSI) technologies.

In a normal planar MOS transistor, a channel extends in a horizontal direction along the upper surface of a semiconductor substrate. However, a channel of an SGT extends in a direction orthogonal to the upper surface of a semiconductor substrate (refer to Non Patent Literature 1, for example). Thus, densification of a semiconductor device is possible with the SGT unlike with the planar MOS transistor. The SGT can be used as a selection transistor to achieve high integration of a dynamic random access memory (DRAM; refer to Non Patent Literature 2, for example) connected to a capacitor, a phase change memory (PCM; refer to Non Patent Literature 3, for example) connected to a resistance change element, a resistive random access memory (RRAM; refer to Non Patent Literature 4, for example), a magneto-resistive random access memory (MRAM refer to Non Patent Literature 5, for example) that changes resistance by changing the orientation of magnetic spin by current, and the like. In addition, there are, for example, a DRAM memory cell (refer to Non Patent Literature 6) including no capacitor and constituted by one MOS transistor, and a DRAM memory cell (refer to Non Patent Literature 8) including a groove portion in which carriers are accumulated and two gate electrodes. However, a problem with a DRAM including no capacitor has been that a sufficient voltage margin cannot be obtained due to high dependency on coupling of a gate electrode to a word line of a floating body. Furthermore complete depletion of a substrate provides a severe adverse effect. The present application relates to a memory device using a semiconductor element and only including an MOS transistor without a resistance change element or a capacitor.

CITATION LIST

Non Patent Literature

Non Patent Literature 1

Hiroshi Takata, Kazumasa Sunouchi, Naoko Okabe, Akihiro Nitayama, Katsuhiko Hieda, Fumio Horiguchi, and Fujio Masuoka: IEEE Transaction on Electron Devices, Vol. 38, No. 3, pp. 573-578 (1991)

Non Patent Literature 2

H. Chung, H. Kim, H. Kim, K. Kim, S. Kim, K. Dong, J. Kim, Y. C. Oh, Y. Hwang, H. Hong, G. Jin, and C. Chung: "4F2 DRAM Cell with Vertical Pillar Transistor (VPT)", 2011 Proceeding of the European Solid-State Device Research Conference, (2011)

Non Patent Literature 3

H. S. Philip Wong, S. Raoux, S. Kim, Jiale Diang, J. R. Reifenberg, B. Rajendran, M. Ashegni and K. E. Goodson: "Phase Change Memory", Proceeding of IEEE, Vol. 98, No 12, December, pp. 2201-2227 (2010)

Non Patent Literature 4

T. Tsunoda, K. Kinoshita, H. Noshiro, Y. Yamazaki, T. Iizuka, Y. Ito, A. Takahashi, A. Okano, Y. Sato, T. Fukano, M. Aoki, and Y. Sugiyama: "Low Power and high Speed Switching of Ti-doped NiO ReRAM under the Unipolar Voltage Source of less than 3V", IEDM (2007)

Non Patent Literature 5

W. Kang, L. Zhang, J. Klein, Y. Zhang, D. Ravelosona, and W. Zhao: "Reconfigurable Codesign of STT-MRAM Under Process Variations in Deeply Scaled Technology", IEEE Transaction on Electron Devices, pp. 1-9 (2015)

Non Patent Literature 6

M. G. Ertosum, K. Lim, C. Park, J. Oh, P. Kirsch, and K. C. Saraswat: "Novel Capacitorless Single-Transistor Charge-Trap DRAM (1T CT DRAM) Utilizing Electron", IEEE Electron Device Letter, Vol. 31, No. 5, pp. 405-407 (2010)

Non Patent Literature 7

E. Yoshida, T, Tanaka, "A Capacitorless 1T-DRAM Technology Using Gate-Induced Drain-Leakage (GIDL) Current for Low-Power and High-Speed Embedded Memory", IEEE Trans, on Electron Devices vol. 53, pp. 692-697 (2006)

Non Patent Literature 8

Md. Hasan Raza Ansari, Nupur Navlakha, Jae Yoon Lee, Seongjae Cho, "Double-Gate Junctionless 1T DRAM With Physical Barriers for Retention Improvement", IEEE Trans, on Electron Devices vol. 67, pp. 1471-1479 (2020)

SUMMARY OF INVENTION

Technical Problem

In a single-transistor DRAM (gain cell) including no capacitor in a memory device, capacitive coupling between a word line and a body including a floating element is large, and amplification of the potential of the word line at data reading and writing is directly transferred as noise to the body of a semiconductor substrate, which has been a problem. As a result, problems such as false reading and false rewriting of stored data occur, and practical use of a single-transistor DRAM (gain cell) including no capacitor has been difficult. Thus, it is needed to solve the above-described problem and densify a DRAM memory cell.

Solution to Problem

To solve the above-described problem, a memory device using a semiconductor element according to a first invention includes:
- a substrate;
- a first semiconductor layer on the substrate;
- a groove having a column shape and extending in a vertically downward direction from a surface of the first semiconductor layer;
- a first insulating layer covering a sidewall of the groove except for a bottom part;
- a first impurity layer contacting the first semiconductor layer and the first insulating layer near the bottom part of the groove;
- a second impurity layer contacting the first impurity layer and the first insulating layer inside the groove;
- a second insulating layer coating the surface of the first semiconductor layer and a surface of the first insulating layer except for the second impurity layer;
- a second semiconductor layer contacting the second impurity layer and the second insulating layer;
- a first gate insulating layer surrounding part or entire of the second semiconductor layer;
- a first gate conductor layer covering part or entire of the first gate insulating layer;
- a third impurity layer and a fourth impurity layer disposed on the second semiconductor layer and contacting a side surface of the second semiconductor layer outside respective ends of the first gate conductor layer;
- a first wire conductor layer connected to the third impurity layer;
- a second wire conductor layer connected to the fourth impurity layer;
- a third wire conductor layer connected to the first gate conductor layer; and
- a fourth wire conductor layer connected to the first semiconductor layer, in which
- memory write operation is performed by controlling voltage applied to the first wire conductor layer, the second wire conductor layer, the third wire conductor layer, and the fourth wire conductor layer to perform operation of generating electrons and holes in the second semiconductor layer and the second impurity layer by an impact ionization phenomenon with current flowing between the third impurity layer and the fourth impurity layer or by gate-induced drain leakage current, operation of removing the electrons or holes that are minority carriers in the second semiconductor layer and the second impurity layer among the generated electrons and holes, and operation of leaving, in the second semiconductor layer and the second impurity layer, some or all of the electrons or holes that are majority carriers in the second semiconductor layer and the second impurity layer, and
- memory erase operation is performed by controlling voltage applied to the first wire conductor layer, the second wire conductor layer, the third wire conductor layer, and the first semiconductor layer to remove the left electrons or holes that are majority carriers in the second semiconductor layer from at least one of the first impurity layer, the third impurity layer, and the fourth impurity layer (first invention).

A second invention is the above-described first invention in which the first wire conductor layer connected to the third impurity layer is a source line, the second wire conductor layer connected to the fourth impurity layer is a bit line, the third wire conductor layer connected to the first semiconductor layer is a plate line, the fourth wire conductor layer connected to the first gate conductor layer is a word line, and memory writing and erasure are performed by providing voltage to the source line, the bit line, the plate line, and the word line (second invention).

A third invention is the above-described first invention in which a bottom part of the second impurity layer is positioned at a part deeper than the surface of the first semiconductor layer (third invention).

A fourth invention is the above-described first invention in which majority carriers in the first impurity layer are different from majority carriers in the first semiconductor layer (fourth invention).

A fifth invention is the above-described first invention in which majority carriers in the second impurity layer are same as majority carriers in the first semiconductor layer (fifth invention).

A sixth invention is the above-described first invention in which majority carriers in the third impurity layer and the fourth impurity layer are same as majority carriers in the first impurity layer (sixth invention).

A seventh invention is the above-described first invention in which concentration is lower in the first impurity layer than in the third impurity layer and the fourth impurity layer (seventh invention).

An eighth invention is the above-described first invention in which the first semiconductor layer, the first impurity layer, the second impurity layer, the second semiconductor layer, and the third impurity layer form a thyristor structure (eighth invention).

A ninth invention is the above-described first invention in which the first semiconductor layer, the first impurity layer, the second impurity layer, the second semiconductor layer, and the fourth impurity layer form a thyristor structure (ninth invention).

A tenth invention is the above-described second invention in which a source-line contact hole for connecting the source line and the third impurity layer, and the first wire conductor layer are shared between adjacent cells (tenth invention).

An eleventh invention is the above-described second invention in which a bit-line contact hole for connecting the bit line and the fourth impurity layer, and the second wire conductor layer are shared between adjacent cells (eleventh invention).

A twelfth invention is the above-described first invention in which the first impurity layers of adjacent cells are connected to each other (twelfth invention).

BRIEF DESCRIPTION OF DRAWINGS

FIGS. 3A, 3B and 3C are diagrams for description of hole carrier accumulation right after the write operation, erase operation, and cell current in the memory device using the semiconductor element according to the first embodiment.

FIGS. 4A, 4B and 4C are diagrams for description of arrangement in which a memory device using a semiconductor element according to a second embodiment in which a first gate conductor layer covers a second semiconductor layer in three directions is two-dimensionally disposed and a sectional structure of the arrangement.

MODE FOR CARRYING OUT THE INVENTION

The structure of a memory device using a semiconductor element according to embodiments of the present invention, a drive method thereof, and the behavior of accumulation carriers therein will be described below with reference to the accompanying drawings.

First Embodiment

The structure and operation mechanism of a memory cell using a semiconductor element according to a first embodiment of the present invention will be described below with reference to FIGS. 1A-1C to 3A-3C. The cell structure of the memory using the semiconductor element according to the present embodiment will be described below with reference to FIGS. 1A to 1C. The writing mechanism and carrier behavior of the memory using the semiconductor element will be described below with reference to FIGS. 2A to 2C, and the data erase mechanism thereof will be described below with reference to FIGS. 3A to 3C.

Figures 1A, 1B, 1C:
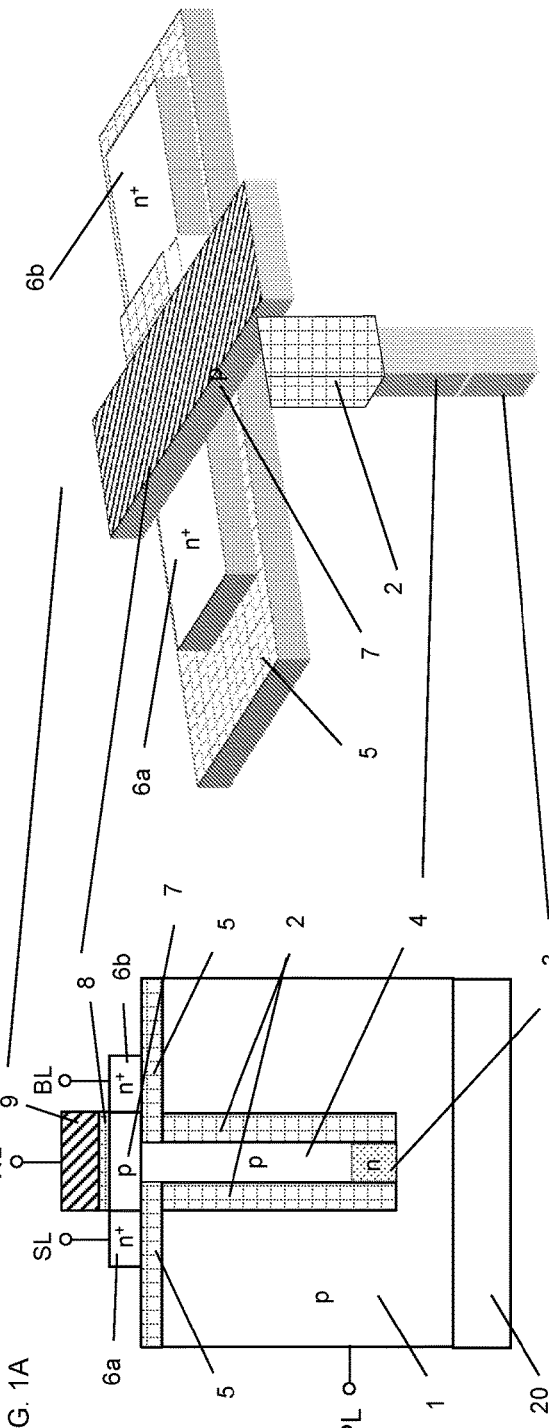
FIGS. 1A, 1B and 1C illustrate a sectional structure of a memory device using a semiconductor element according to a first embodiment and a bird's eye view thereof.

FIG. 1A illustrates a sectional structure of the memory using the semiconductor element according to the first embodiment of the present invention. A p layer 1 (example of a "first semiconductor layer" in the claims) made of silicon, containing acceptor impurities, and having a p-type conduction type is disposed on a substrate 20 (example of a "substrate" in the claims). A groove having a column shape is provided in the vertical direction from a surface of the p layer 1, and the sidewall of the groove is covered by a first insulating layer 2 (example of a "first insulating layer" in the claims). A semiconductor including an n layer 3 (example of a "first impurity layer" in the claims) containing donor impurities and contacting the p layer 1 and the first insulating layer is disposed at a bottom part of the groove, an p layer 4 (example of a "second impurity layer" in the claims) containing acceptor impurities is disposed on the n layer 3. A second insulating layer 5 (example a "second insulating layer" in the claims) is disposed on the surface except for the p layer 4. A p layer 7 (example of a "second semiconductor layer" in the claims) containing acceptor impurities contacts the p layer 4.

An $n^+$ layer 6a (example of a "third impurity layer" in the claims) containing donor impurities at high concentration (hereinafter, a semiconductor region containing donor impurities at high concentration is referred to as an "$n^+$ layer") is disposed on a side of the second semiconductor layer 7 in the right-left direction in FIG. 1A. An $n^+$ layer 6b (example of a "fourth impurity layer" in the claims) is disposed on a side opposite the $n^+$ layer 6a.

A first gate insulating layer 8 (example of a "first gate insulating layer" in the claims) is disposed on the surface of the second semiconductor layer 7. The first gate insulating layer 8 contacts or is positioned close to each of the $n^+$ layers 6a and 6b. A first gate conductor layer 9 (example of a "first gate conductor layer" in the claims) contacts the first gate insulating layer 8 on a side opposite the second semiconductor layer 7.

Accordingly, a memory device using a semiconductor element including the substrate 20, the p layer 1, the first insulating layer 2, the second insulating layer 5, the n layer 3, the p layer 4, the $n^+$ layer 6a, the $n^+$ layer 6b, the second semiconductor layer 7, the first gate insulating layer 8, and the first gate conductor layer 9 is formed. The $n^+$ layer 6a is connected to a source line SL (example of a "source line" in the claims) that is a first wiring conductive layer, the $n^+$ layer 6b is connected to a bit line Pt (example of a "bit line" in the claims) that is second wiring conductive layer, the p layer 1 is connected to a plate line PL (example of a "plate line" in the claims) that is a third wiring conductive layer, and the first gate conductor layer 9 is connected to a word line WL (example of a "word line" in the claims) that is a fourth wiring conductive layer. Memory operation is performed by manipulating the potential of the source line, the potential of the bit line, the potential of the plate line, and the potential of the word line. Hereinafter, the memory device is also referred to as a dynamic flash memory.

In the memory device, a plurality of above-described dynamic flash memory cells are one- or two-dimensionally disposed on the first semiconductor layer 1.

FIG. 1B illustrates a bird's eye view of a memory cell structure according to the present embodiment. In the diagram, to facilitate understanding, the p layer 1 and part of the first insulating layer 2, which is close to the bottom part of the groove are partially removed and the n layer 3, the p layer 4, the $n^+$ layer 6a, the $n^+$ layer 6b, the p layer 7, the first gate insulating layer 8, and the first gate conductor layer 9 are illustrated.

The first semiconductor layer 1 is a p-type semiconductor in FIGS. 1A to 1C, but a profile may be provided for impurity concentration. In addition, profiles may be provided for impurity concentrations of the first impurity layer 3, the second impurity layer 4, and the second semiconductor layer 7.

When the $n^+$ layer 6a and the $n^+$ layer 6b are formed as $p^+$ layers (hereinafter, a semiconductor region containing acceptor impurities at high concentration is referred to as a "$p^+$ layer") in which majority carriers are holes, operation of a dynamic flash memory is performed with electrons as writing carriers by employing n-type semiconductors as the first semiconductor layer 1, the p layer 4, and the p layer 7 and employing a p-type semiconductor as the n layer 3.

The first semiconductor layer 1 is a p-type semiconductor in FIGS. 1A to 1C, but operation of a dynamic flash memory is performed by using an n-type semiconductor substrate as the substrate 20, forming a p well as the first semiconductor layer 1, and disposing a plurality of memory cells of the present invention in the p well.

The second semiconductor layer 7 is a p-type semiconductor in FIGS. 1A to 1C, but a p-type, n-type, or i-type semiconductor may be used as the second semiconductor layer 7, depending on the majority carrier concentration of the p layer 4, the thickness of the second semiconductor layer 7, the material and thickness of the first gate insulating layer 8, and the material of the first gate conductor layer 9.

A bottom part of the p layer 7 aligns with the surface of the second insulating layer 5 in the illustration of FIGS. 1A to 1C, but the interface between the p layer 4 and the p layer 7 does not necessarily need to align with the surface of the second insulating layer 5 as long as the p layer 4 contacts the p layer 7 and a bottom part of the p layer 4 is deeper than the surface of the p layer 1.

A bottom part of the n layer 3 aligns with a bottom part of the first insulating layer 2 in the illustration of FIGS. 1A to 1C, but does not need to align as long as the n layer 3 contacts both the p layer 1 and the first insulating layer 2. FIG. 1C illustrates an example of such a configuration. In other words, the n layer 3 only needs to be formed near the bottom part of the groove. Moreover, the n layer 3 may extend in the lateral direction and may be connected to part of the n layer 3 of an adjacent memory cell.

Although FIGS. 1A to 1C illustrates a normal MOS transistor structure formed of the n layers 6a and 6b, the gate insulating layer 8, the p layer 7, and the gate conductor layer 9, memory operation may be performed with a FINFET in which the interface between the p layer 7 and the gate insulating layer 8 is positioned higher than the n layers 6a and 6b.

The substrate 20 may be an insulator, a semiconductor, or a conductor and may be any material that can support the p layer 1.

Figure 2C:
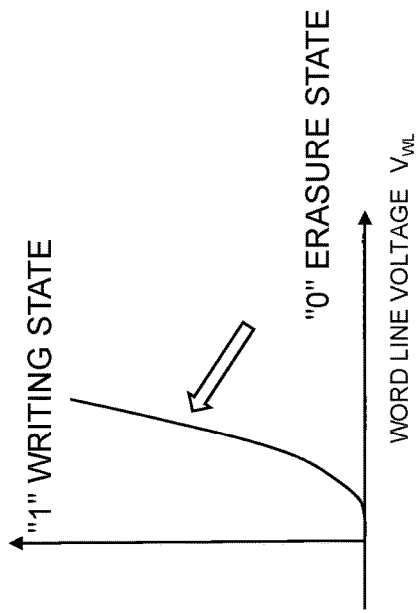
FIGS. 2A, 2B and 2C are diagrams for description of write operation, carrier accumulation right after the operation, and cell current in the memory device using the semiconductor element according to the first embodiment.
Figure 2A:
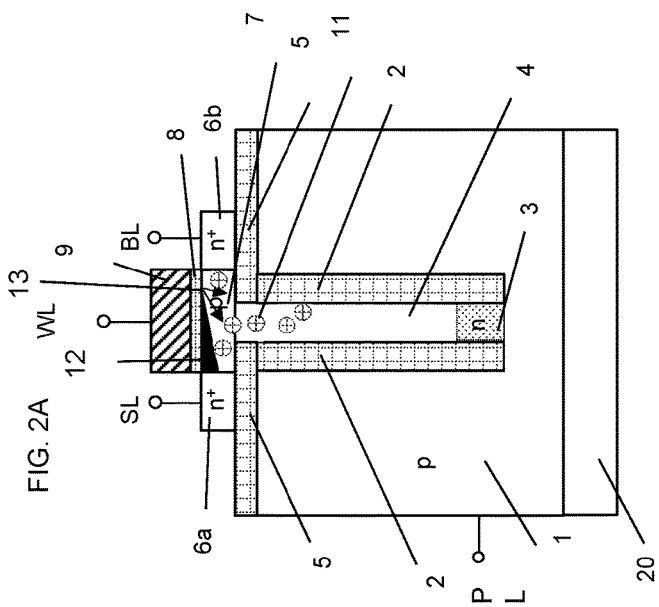

Carrier behavior, accumulation, and cell current in the dynamic flash memory according to the first embodiment of the present invention at write operation will be described below with reference to FIGS. 2A to 2C. Description is made for a case in which majority carriers in the $n^+$ layer 6a and the $n^+$ layer 6b are electrons, for example, $n^+$ poly (hereinafter, poly Si containing donor impurities at high concentration is referred to as "$n^+$ poly") is used as the first gate conductor layer 9 connected to WL, and a p-type semiconductor is used as the second semiconductor layer 7. As illustrated in FIG. 2A, a MOSFET in the memory cell actuates with constituent components of the $n^+$ layer 6a serving as a source, the $n^+$ layer 6b serving as a drain, the first gate insulating layer 8, the first gate conductor layer 9 serving as a gate, and the p layer 7 serving as a substrate. For example, 0 V is input to the $n^+$ layer 6a connected to the source line SL, for example, 3 V is input to the $n^+$ layer 6b connected to the bit line BL, for example, 0 V is set to the p layer 1 connected to the plate line PL, and for example, 1.5 V is input to the first gate conductor layer 9 connected to the word line WL. A partial inversion layer 12 is formed directly below the first gate insulating layer 8 below the first gate conductor layer 9, and a pinch-off point 13 exists. Accordingly, the MOSFET including the first gate conductor layer 9 operates in a saturation region.

As a result, electric field is maximum between the pinch-off point 13 and the $n^+$ layer 6b in the MOSFET including the first gate conductor layer 9, and an impact ionization phenomenon occurs in the region. Due to the impact ionization phenomenon, electrons accelerated from the $n^+$ layer 6a connected to the source line SL toward the $n^+$ layer 6b connected to the bit line BL collide with a Si lattice, and electron-hole pairs are generated by kinetic energy of the electrons. Some of the generated electrons are flow to the first gate conductor layer 9, but most of them flow to the $n^+$ layer 6b connected to the bit line BL.

Note that holes may be generated by causing flow of gate-induced drain leakage (GIDL) current instead of causing the above-described impact ionization phenomenon. (refer to Non Patent Literature 7, for example).

Figure 2B:
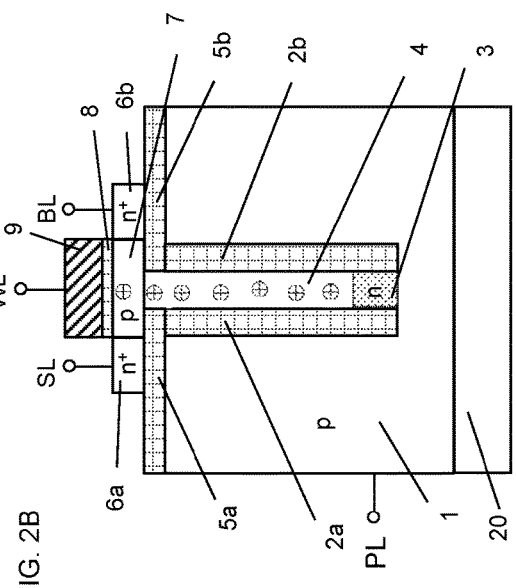

FIG. 2B illustrates holes 11 in the p layer 4 and the p layer 7 when all biases become 0 V right after writing. The generated holes 11 are majority carriers in the p layer 4 and the p layer 7, move toward the p layer 4 due to the gradient of the concentration thereof, are uniformly accumulated in the p layer 4 and the p layer 7 for a short time, and charge the p layer 7 as the substrate of the MOSFET including the first gate conductor layer in positive bias in effect in a non-equilibrium state. Holes in the depleted layer move to the SL side by electric field and recombine with electrons. As a result, the threshold voltage of the MOSFET including the first gate conductor layer 9 decreases due to a positive substrate bias effect by holes temporarily accumulated in the p layer 4 and the p layer 7. Accordingly, as illustrated in FIG. 2C, the threshold voltage of the MOSFET including the first gate conductor layer 9 connected to the word line WL decreases. This write state allocated to logic storage data "1".

Note that conditions on voltage applied to the bit line BL, the source line SL, the word line WL, and the plate line PL described above are examples for performing write operation and may be other operation conditions with which write operation can be performed.

Although $n^+$ poly is used as the first gate conductor layer 9 in FIG. 2A to 2C, for example, $p^+$ poly (hereinafter, poly Si containing acceptor impurities at high concentration is referred to as "$p^+$ poly"), a metal layer such as W, or a layered metal layer such as W/TiN may be used.

According to a structure of the present embodiment, since the p layer 7 of the MOSFET including the first gate conductor layer connected to the word line WL is electrically connected to the p layer 4, the capacity of accumulation of generated holes can be freely changed by adjusting the volume of the p layer 4. Thus, for example, the depth of the p layer 4 may be increased to achieve a longer holding time. Accordingly, it is requested that the bottom part of the p layer 4 is deeper than the surface of the p layer 1. A art at which hole carriers are accumulated, the contact area of the n layer 3, the $n^+$ layer 6a, and $n^+$ layer 6b, which contribute to recombination with electrons, with the p layer 4 and the p layer 7 in this example can be decreased, and thus recombination with electrons can be prevented to increase the holding time of accumulated holes. In addition, because the p layer 1 has a work function at 4.5 eV or higher, holes are accumulated near the interface of the p layer 4 as the second impurity layer contacting the first insulating layer 2, and thus the holes can be stably accumulated. Accordingly, an entire substrate bias effect occurs to the substrate as a memory element, the storage holding time increases, and the voltage margin of "1" writing expands.

An erase operation mechanism will be described below with reference to FIGS. 3A to 3C. FIG. 3A illustrates a state right after the holes 11 generated by impact ionization in the previous cycle are stored in the p layer 4 and the p layer 7 and all biases become 0 V before erase operation. As illustrated in FIG. 3B, at erase operation, the voltage of the source line SL is set to negative voltage VERA. The voltage VERA is, for example, −3 V. As a result, the PN junction of the $n^+$ layer 6a as the source connected to the source line SL and the p layer 7 is forward biased irrespective of the value of the initial potential of the p layer 7. As a result, the holes 11 generated by impact ionization in the previous cycle and stored in the p layer 4 and the p layer 7 move to the $n^+$ layer 6a connected to the source line. Some small number of holes flow from the p layer 4 to the n layer 3 and recombine with electrons. As a result, the hole concentrations of the p layer 4 and the p layer 7 decrease with time, and threshold voltage of the MOSFET becomes higher than at "1" writing and returns to an initial state. Accordingly, as illustrated in FIG. 3C, the MOSFET including the first gate conductor layer 9 connected to the word line WL returns to the original threshold value. The erasure state of the dynamic flash memory is logic storage data "0".

According to the structure of the present embodiment, the p layer 1, the n layer 3, the p layer 4, the p layer 7, and the $n^+$ layer 6a form a thyristor structure. When 3 V is applied to the source line at erasure, a large number of electrons are injected from the source line SL and recombine with accumulated holes and at the same time are drifted to the first impurity layer or the bit line BL by electric field, and thus significant erasure time reduction can be expected. Accordingly, a stable state of logic information data "0" can be achieved in a short time, and the operation speed of the dynamic flash memory element increases.

The above-described thyristor structure may be formed by the p layer 1, the n layer 3, the p layer 4, the p layer 7, and the n⁺ layer 6b, and data erasure is possible and the same effect is obtained by applying, for example, −3 V to the bit line BL.

Note that conditions on voltage applied to the bit line BL, the source line SL, the word line WL, and the plate line PL described above are examples for performing erase operation and may be other operation conditions with which erase operation can be performed.

According to the present embodiment, the p layer 7, which is one of constituent components of the MOSFET configured to read and write information, is electrically connected to the p layer 1, the n layer 3, and the p layer 4. Accordingly, in write operation and erase operation, the substrate bias does not become a floating state during MOSFET operation nor a semiconductor part below the first gate insulating layer is not completely depleted, unlike an SOI structure, for example. Thus, for example, the threshold value and drive current of the MOSFET are unlikely to be affected by an operation situation. Accordingly, as for characteristics of the MOSFET, it is possible to widely set voltage for desired memory operation by adjusting the thickness of the second semiconductor layer 7, the kind, concentration, profile of impurities, the impurity concentration and profile of the p layer 4, the thickness and material of the first gate insulating layer 8, and the work function of the first gate conductor layer 9. Moreover, since a part below the MOSFET is not completely depleted and the depleted layer expands in the depth direction of the p layer 4, coupling of a gate electrode to the word line of a floating body, which is a disadvantage of a DRAM including no capacitor, hardly has influence. Thus, according to the present embodiment, it is possible to design a wide margin of operation voltage as the dynamic flash memory.

Although voltage is not actively applied to the n layer 3 in the present embodiment, an electrode connected thereto may be formed to stabilize the memory cell.

The present embodiment has the following characteristics.

Characteristic 1

In the dynamic flash memory according to the first embodiment of the present invention, a substrate region in which a MOSFET channel is formed is constituted by the first insulating layer 2, the second impurity layer 4 surrounded by the first impurity layer 3, and the second semiconductor layer 7. With this structure, majority carriers generated at writing of logic data "1" can be accumulated in the second semiconductor layer 7 and the second impurity layer 4 and the number thereof can be increased, and thus an information holding time increases. At data erasure, it is easy to perform erasure by providing negative voltage to the n⁺ layer 6a connected to the source line SL because of the thyristor structure of the n⁺ layer 6a, the p layer 4, the n layer 3, and the p layer 1. Thus, the margin of memory operation can be expanded and electric power consumption can be reduced, which leads to high-speed memory operation.

Characteristic 2

The p layer 7 as the second semiconductor layer, which is one of constituent components of the MOSFET in the dynamic flash memory according to the first embodiment of the present invention, is electrically connected to the p layer 4 as the second impurity layer, the n layer 3 as the first impurity layer, and the p layer 1 as the first semiconductor layer, and thus the p layer 7 below the first gate insulating layer 8 is not completely depleted. Thus, for example, the threshold value and drive current of the MOSFET are unlikely to be affected by an operation situation. In addition, since a part below the MOSFET is not completely depleted, coupling of a gate electrode to the word line of a floating body, which is a disadvantage of a DRAM including no capacitor, does not have large influence. Thus, according to the present invention, it is possible to widely design the margin of operation voltage as the dynamic flash memory.

Second Embodiment

A dynamic flash memory according to a second embodiment of the present invention will be described below with reference to FIGS. 4A to 4C. In FIGS. 4A to 4C, any part identical or similar to that in FIGS. 1A to 1C is denoted by the same reference number. Letters a, b, c, and d provided after a number indicate respective cells for distinction. FIG. 4A illustrates a plan view of arrangement of four cells of the dynamic flash memory according to the second embodiment. FIG. 4B illustrates a vertical cross-sectional view of the cells along line X-X' in FIG. 4A, and FIG. 4C illustrates a vertical cross-sectional view of the cells along line Y-Y' in FIG. 4A.

Description will be first made on cell operation of the dynamic flash memory with a focus on a cell at which line X-X' and line Y-Y' intersect in FIG. 4A. The cell is one cell of a dynamic flash memory including, as constituent components, the substrate 20, the p layer 1, a first insulating layer 2a, the second insulating layer 5, an n layer 3a, a p layer 4a, the n⁺ layer 6a, an n⁺ layer 6c, a second semiconductor layer 7a, a first gate insulating layer 8a, and a first gate conductor layer 9a as described above in the first embodiment.

The first gate insulating layer 8a is formed to cover the surface and side surface of the second semiconductor layer 7a, and the first gate conductor layer 9 is formed to cover the first gate insulating layer 8a and part of the second insulating layer 5. This is what is called a FIN structure.

A first wire conductor layer 35 (example of a "first wire conductor layer" in the claims) as the source line SL is connected to the n⁺ layer 6a in a contact hole 32a (example of a "source-line contact hole" in the claims). A second wire conductor layer 39 (example of a "second wire conductor layer" in the claims) that is part of the bit line is connected to the n⁺ layer 6c in a contact hole 33c (example of a "bit-line contact hole" in the claims) through a wire conductor layer 36 and a contact hole 37c (example of the "bit-line contact hole" in the claims). Note that the n⁺ layer 6a, the first wire conductor layer 35, and the contact hole 32a are shared and used by cells adjacent to each other in the direction of line X-X'. Similarly, the n⁺ layer 6b, the second wire conductor layer 39, and the contact hole 33c are shared and used by cells adjacent to each other in the direction of line Y-Y'.

For example, 0 V is input from the first wire conductor layer 35 as the source line SL to the n⁺ layer 6a through the contact hole 32a, for example, 3 V is input from the second wire conductor layer 39 as the bit line BL to the n⁺ layer 6c through the contact hole 33c, for example, 0 V is set to the p layer 1 connected to the plate line PL, and for example, 1.5 V is input to the first gate conductor layer 9a connected to a word line WL1. With this biasing, a MOSFET including the first gate conductor layer 9a operates in a saturation region.

As a result, the impact ionization phenomenon occurs in a channel region of the MOSFET including the first gate conductor layer 9a. Due to the impact ionization phenomenon, electrons accelerated from the n⁺ layer 6a connected to the source line SL toward the n⁺ layer 6c connected to the bit line BL collide with a Si lattice, and electron-hole pairs are generated by kinetic energy of the electrons. Some of the generated electrons flow to the first gate conductor layer 9a, but most of them flow to the n⁺ layer 6c connected to the bit line BL.

The generated holes 11 are majority carriers in the p layer 4a and the p layer 7a, move toward the p layer 4 a due to the gradient of the concentration thereof, are accumulated in the p layer 4a and the p layer 7a for a short time, and charge the substrate of the MOSFET including the first gate conductor layer 9a in positive bias in effect in a non-equilibrium state. As a result, the threshold voltage of the MOSFET including the first gate conductor layer 9a decreases due to a positive substrate bias effect by holes temporarily accumulated in the p layer 4a and the p layer 7a. Accordingly, the threshold voltage of the MOSFET including the first gate conductor layer 9a connected to the word line WL1 decreases. This write state is allocated to logic storage data "1".

As described above in the first embodiment, this write operation is also possible with GIDL current under different bias conditions.

At erasure, as described above with reference to FIG. 3A to 3C, the voltage of the source connected to the first wire conductor layer 35 is set to negative voltage VERA The voltage VERA is, for example, −3 V. As a result, the PN junction of the n⁺ layer 6a as the source connected to the source line SL and the p layer 7a is forward biased. The holes 11 generated by impact ionization in the cycle of "1" writing and stored in the p layer 4a and the p layer 7a move to the n⁺ layer 6a connected to the source line. As a result, the hole concentrations of the second semiconductor layer 7a and the second impurity layer 4a decrease with time, and the threshold voltage of the MOSFET becomes higher than at "1" writing and returns to an initial state. Accordingly, the MOSFET including the first gate conductor layer 9a connected to the word line WL1 returns to the original threshold value. The erasure state of the dynamic flash memory is logic storage data "0".

Advantages of the present invention are described above with reference to FIGS. 1A-1C to 3A-3C, and main points thereof are the same for the structure in FIGS. 4A to 4C. With the structure in FIGS. 4A to 4C, in addition, an effective MOSFET channel width is longer and cell current is larger than with the structure in FIGS. 1A to 1C, and thus the number of surplus holes generated at "1" writing is larger and the efficiency of write operation is higher. Moreover, cell sense current is larger and memory operation is faster.

As illustrated in FIG. 4A, the cell size of the dynamic flash memory according to the present embodiment in an X direction is determined by lines and spaces of grooves at which the second semiconductor layers 7a and 7b are formed. The cell size thereof in a Y direction is determined by lines and spaces of the first gate conductor layers 9a and 9c or lines and spaces of the first wire conductor layer 35 and the wire conductor layer 36. Thus, the cell sizes can be achieved in $4F^2$ where F represents the minimum dimension in manufacturing, which contributes to reduction of the memory cell size, in other words, reduction of the memory chip area. This is the same for the cell structure in FIGS. 1A to 1C. Moreover, the memory cell area and the chip area can be further reduced by using, for example, a technology such as multiple exposure, a self-alignment technology at contact hole production, and a honeycomb structure for disposition of grooves surrounded by the first insulating layers 2a, 2b, and 2c and the like.

The contact hole 33c connected to the line BL, the wire conductor layer 36, the contact hole 37c, and the wire conductor layer 39 are separately formed in the illustration of FIGS. 4A to 4C, but the contact holes and the wire conductor layers may be formed all at once by using a damascene method or the like after insulating layers 31 and 38 are formed.

Note that the sectional shape of the p layer 7 as the second semiconductor layer or the like is a rectangle in FIGS. 4A to 4C but may be a trapezoid or a polygon including a triangle.

Note that description is made with a focus on one cell in the example illustrated in FIGS. 4A to 4C but operation of a dynamic flash memory is possible with another independent cell or a collection of cells by providing voltage to the bit line, the source line, the word line, and the plate line independently or in synchronization.

The present embodiment has the following characteristics.

Characteristic 1

In the dynamic flash memory cell illustrated in FIGS. 4A to 4C, the n⁺ layer 6a, the first wire conductor layer 35 connected to the source line SL, and the contact hole 32a are shared by adjacent cells. In addition, the n⁺ layer 6c, the second wire conductor layer 39 connected to the bit line BL, and the contact hole 33c are shared by adjacent cells. Accordingly, the cell area of the dynamic flash memory according to the present invention is determined by lines and spaces of the p layers 7a and 7b and the first gate conductor layers 9a and 9c or lines and spaces of the first wire conductor layers 35 and 36. Thus, the cell area is $4F^2$ where F represents the minimum dimension in manufacturing, and accordingly, a minute memory cell can be provided.

Characteristic 2

Since the second semiconductor layer 7 is surrounded by the gate electrodes of the MOSFET of a cell and an effective channel width is large, the number of surplus holes at writing can be increased and cell current can be increased to enable to high-speed memory operation.

The present invention can have various embodiments and modifications without departing from the wider spirit and scope of the present invention. Each above-described embodiment is only intended to describe an example of the present invention and does not limit the scope of the present invention. Any above-described example and modification may be optionally combined. Some constituent components of the above-described embodiment may be omitted as necessary within the technological idea of the present invention.

Industrial Applicability

With a memory function using a semiconductor element according to the present invention, it is possible to provide a high-speed dynamic flash memory with a longer storage time and a smaller amount of electric power consumption than in conventional cases.

The invention claimed is:

1. A memory device using a semiconductor element, the memory device comprising:

a substrate;

a first semiconductor layer on the substrate;

a groove having a column shape and extending in a vertically downward direction from a surface of the first semiconductor layer;

a first insulating layer covering a sidewall of the groove except for a bottom part;

a first impurity layer contacting the first semiconductor layer and the first insulating layer near the bottom part of the groove;

a second impurity layer contacting the first impurity layer and the first insulating layer inside the groove;

a second insulating layer coating the surface of the first semiconductor layer and a surface of the first insulating layer except for the second impurity layer;

a second semiconductor layer contacting the second impurity layer and the second insulating layer;

a first gate insulating layer surrounding part or entire of the second semiconductor layer;

a first gate conductor layer covering part or past entire of the first gate insulating layer;

a third impurity layer and a fourth impurity layer disposed on the second semiconductor layer and contacting a side surface of the second semiconductor layer outside respective ends of the first gate conductor layer;

a first wire conductor layer connected to the third impurity layer;

a second wire conductor layer connected to the fourth impurity layer;

a third wire conductor layer connected to the first gate conductor layer; and a fourth wire conductor layer connected to the first semiconductor layer, wherein memory write operation is performed by controlling voltage applied to the first wire conductor layer, the second wire conductor layer, the third wire conductor layer, and the fourth wire conductor layer to perform operation of generating electrons and holes in the second semiconductor layer and the second impurity layer by an impact ionization phenomenon with current flowing between the third impurity layer and the fourth impurity layer or by gate-induced drain leakage current, operation of removing the electrons or holes that are minority carriers in the second semiconductor layer and the second impurity layer among the generated electrons and holes, and operation of leaving, in the second semiconductor layer and the second impurity layer, some or all of the electrons or holes that are majority carriers in the second semiconductor layer and the second impurity layer, and memory erase operation is performed by controlling voltage applied to the first wire conductor layer, the second wire conductor layer, the third wire conductor layer, and the first semiconductor layer to remove the left electrons or holes that are majority carriers in the second semiconductor layer from at least one of the first impurity layer, the third impurity layer, and the fourth impurity layer.

2. The memory device using the semiconductor element according to claim 1, wherein the first wire conductor layer connected to the third impurity layer is a source line, the second wire conductor layer connected to the fourth impurity layer is a bit line, the third wire conductor layer connected to the first semiconductor layer is a plate line, the fourth wire conductor layer connected to the first gate conductor layer is a word line, and memory writing and erasure are performed by providing voltage to the source line, the bit line, the plate line, and the word line.

3. The memory device using the semiconductor element according to claim 1, wherein a bottom part of the second impurity layer is positioned at a part deeper than the surface of the first semiconductor layer.

4. The memory device using the semiconductor element according to claim 1, wherein majority carriers in the first impurity layer are different from majority carriers in the first semiconductor layer.

5. The memory device using the semiconductor element according to claim 1, wherein majority carriers in the second impurity layer are same as majority carriers in the first semiconductor layer.

6. The memory device using the semiconductor element according to claim 1, wherein majority carriers in the third impurity layer and the fourth impurity layer are same as majority carriers in the first impurity layer.

7. The memory device using the semiconductor element according to claim 1, wherein concentration is lower in the first impurity layer than in the third impurity layer and the fourth impurity layer.

8. The memory device using the semiconductor element according to claim 1, wherein the first semiconductor layer, the first impurity layer, the second impurity layer, the second semiconductor layer, and the third impurity layer form a thyristor structure.

9. The memory device using the semiconductor element according to claim 1, wherein the first semiconductor layer, the first impurity layer, the second impurity layer, the second semiconductor layer, and the fourth impurity layer form a thyristor structure.

10. The memory device using the semiconductor element according to claim 2, wherein a source-line contact hole for connecting the source line and the third impurity layer, and the first wire conductor layer are shared between adjacent cells.

11. The memory device using the semiconductor element according to claim 2, wherein a bit-line contact hole for connecting the bit line and the fourth impurity layer, and the second wire conductor layer are shared between adjacent cells.

12. The memory device using the semiconductor element according to claim 1, wherein the first impurity layers of adjacent memory cells are partially connected to each other and desired voltage can be applied to the first impurity layers.

* * * * *

UNITED STATES PATENT AND TRADEMARK OFFICE
CERTIFICATE OF CORRECTION

PATENT NO. : 12,302,548 B2
APPLICATION NO. : 17/903502
DATED : May 13, 2025
INVENTOR(S) : Masakazu Kakumu et al.

It is certified that error appears in the above-identified patent and that said Letters Patent is hereby corrected as shown below:

In the Claims

Column 13, Claim 1, Line 23, delete "past"

Signed and Sealed this
First Day of July, 2025

Coke Morgan Stewart
*Acting Director of the United States Patent and Trademark Office*